United States Patent [19]

Kiyama et al.

[11] Patent Number: 4,981,525
[45] Date of Patent: Jan. 1, 1991

[54] PHOTOVOLTAIC DEVICE

[75] Inventors: Seiichi Kiyama, Takatsuki; Hiroshi Hosokawa, Hirakata; Yutaka Hirono, Neyagawa, all of Japan

[73] Assignee: Sanyo Electric Co., Ltd., Osaka, Japan

[21] Appl. No.: 308,390

[22] Filed: Feb. 9, 1989

[30] Foreign Application Priority Data

| Feb. 19, 1988 | [JP] | Japan | 63-37964 |
| Sep. 30, 1988 | [JP] | Japan | 63-247842 |
| Oct. 3, 1988 | [JP] | Japan | 63-249324 |
| Oct. 5, 1988 | [JP] | Japan | 63-251201 |
| Oct. 5, 1988 | [JP] | Japan | 63-251202 |

[51] Int. Cl.$^5$ .............................. H01L 31/05
[52] U.S. Cl. .................. 136/244; 136/256; 136/258; 357/30
[58] Field of Search ............ 136/244, 256, 258 AM; 357/30 J, 30 K, 30 Q

[56] References Cited

U.S. PATENT DOCUMENTS

| 4,786,607 | 11/1988 | Yamazaki et al. | 437/2 |
| 4,849,029 | 7/1989 | Delahoy | 136/249 |
| 4,865,999 | 9/1989 | Xi et al. | 437/2 |
| 4,872,925 | 10/1989 | McMaster | 136/244 |

FOREIGN PATENT DOCUMENTS

| 60-149178 | 8/1985 | Japan | 136/244 |
| 62-154788 | 7/1987 | Japan | 136/244 |

Primary Examiner—Aaron Weisstuch
Attorney, Agent, or Firm—Darby & Darby

[57] ABSTRACT

A metallic insulative substrate having its surface coated with an insulative layer, on which a large number of photoelectric converter elements are electrically connected to each other in series by connecting the first back electrode layer of one of photoelectric converter elements adjoining each other with the second back electrode layer of the other. Accordingly, electrical connection of these electrode layers in series does not affect the effective area used for photoelectric conversion. This constitution also improves heat resistance of the insulative substrate. Electrical contact of the transparent light-receiving electrode layer) and the second back electrode layer is achieved via contact holes each having a diameter identical to the diameter of those of the insulative and semiconductive layers. As a result, a sufficient insulative distance is provided between the transparent electrode layer and the first back electrode layer so that occurrence of accidental shortcircuit can be securely prevented.

6 Claims, 15 Drawing Sheets

Rs: Series R       Rsh: Shunt R
Rc: Contact R      Rst: Sheet R

PHOTOVOLTAIC DEVICE

BACKGROUND OF THE INVENTION

1. Field of the Invention

The present invention relates to a photovoltaic device which generates electromotive force when radiated with light.

2. Description of the Prior Art

Desirably, the light-receiving electrode layer (hereinafter referred to as transparent electrode layer) of a photovoltaic device which generates electromotive force on exposure to light should be transparent in order that light can be transmitted to the semiconductive layer which contains the photo-active layer providing photoelectric conversion. Accordingly, conventional transparent electrode layers are mainly composed of a transparent conductive oxide (TCO) such as $In_2O_3$, $SnO_2$, or ITO which are, respectively, the oxidized products of indium (In), tin (Sn), and a combination thereof. It is rarely composed of a thin metal layer. Such an electrode composed of TCO has a sheet resistance value of about 10 through 50 $\Omega/\square$, which is 3 orders of magnitude higher than that of a thin metal layer made from aluminum having identical thickness. This causes those electrode layers made from TCO to cause a slight loss of power (due to resistance) and to lower the current collecting efficiency.

To prevent lowering of the current collecting efficiency, Japanese Patent Application Laid-Open No. 59-50576 (1984) had proposed providing the light-receiving-side with gridshaped current-collecting electrodes made from a metallic substance.

Because of its lower resistance value that of a transparent oxide electrode layer, a current collecting metal electrode layer can prevent degradation of current collecting efficiency. On the other hand, since the current-collecting metal electrode blocks light which should reach the photoactive layer, the metal electrode unavoidably reduces the effective light-receiving area where photoelectric conversion is executed.

To solve this problem, improved photovoltaic devices were proposed by Japanese Patent Application Laid-Open Nos. 60-0149178 (1985), 61-20371 (1986), and by Japanese Utility Model Application Laid-Open No. 61-86955 (1986), respectively. These photovoltaic devices respectively reduce resistance loss of the transparent electrode layer without significantly sacrificing effective light-receiving area despite the presence of highly-resistant TCO or thin metal layer used for composing the transparent electrode layer. FIG. 1 is the sectional view of the photovoltaic device proposed by one of the above references. Each photoelectric converter element $SC_1$, $SC_2$, $SC_3$, ... is respectively connected to an adjacent converter element by superimposing the transparent electrode layer 11, semiconductive layer 12, the first back electrode layer 13 composed of ohmic metal, insulative layer 14, and the second back electrode layer 15 having a resistance value lower than that of the transparent electrode layer 11, on transparent light-incident substrate 17. In this photovoltaic device, a plurality of connection conductors 18 made from the same material as the second back electrode layer 15 are inserted in contact holes 16 having their inner surfaces being surrounded by insulative layer 14, at a plurality of locations in the light-receiving region so that the transparent electrode layer 11 can be electrically connected to the second back electrode layer 15. A plurality of photoelectric converter elements $SC_1$, $SC_2$, $SC_3$, ... are formed on the transparent insulative substrate 17, where adjoining photoelectric converter elements are electrically connected to each other in series by combining the first back electrode layer 13 of one of the adjacent photoelectric converter elements with the second back electrode layer 15 of the other.

The photoelectric converter elements of the above-cited photovoltaic device electrically connect the high-resistance transparent electrode layer 11 and the low-resistance second back electrode layers 15 at a plurality of locations, whereby the current path in the transparent electrode layer 11 extends up to the connection with the low-resistance second back electrode layer 15, whereby resistance losses due to the transparent electrode layer 11 can be reduced without substantially decreasing the effective light-receiving area.

Because of low cost and easy fabrication into optional shape, glass is conventionally used for the insulative substrate 17. Nevertheless, since glass softens at about 550° C., it cannot withstand heat treatment of more than 600° C. As a result, when forming semiconductive layer 12 having semiconducting junctions, only processes such as evaporation, sputtering, plasma CVD, and photo CVD using low temperatures are applicable. This in turn confines the range of materials usable for semiconductive layer 12, and thus material can be selected only from amorphous silicon, amorphous silicon carbide, amorphous silicon germanium, amorphous germanium, and microcrystalline silicon, which are generated by means of plasma CVD or photo CVD and the like using a maximum substrate temperature of 300° C.

FIG. 2 is an enlarged sectional view of the unction of the transparent electrode layer 11 and the second back electrode layer 15. Since the inner surface of contact hole 16 is covered with insulative layer 14, the transparent electrode layer 11 is not directly connected to the first back electrode layer 13. However, if the thickness of semiconductive layer 12 is less than 1 82 m, in particular, if the thickness is about 0.5 μm, leakage current will be generated through the edge portion 12a of the junction, and accidental short circuits may occur.

The intervals between adjacent photoelectric converter elements and junctions (contact holes 16) constitute specific regions which do not contribute to the generation of power, thereby adversely affecting output power. These intervals are essential for connecting a plurality of photoelectric converter elements in series. Because of the precision needed for processing, the minimum size of the intervals is predetermined. Consequently, in order to reduce the regions which do not contribute to the generation of power, the size of contact holes 16 and the intervals between each contact hole 16 should be set to optimal values.

Etching processes using photomasks are conventionally used for removing layers for providing contact holes 16. However, it is quite difficult for etching processes to precisely locate finely spaced positions. Furthermore, etching requires a large number of steps to be executed, and cannot easily form fine contact holes 16.

SUMMARY OF THE INVENTION

The invention has been achieved to fully solve the problems mentioned above. The photovoltaic device of the invention uses an insulative substrate composed of a metal substrate whose surface is provided with an insulative layer.

The primary object of the invention is to provide a novel photovoltaic device which drastically expands the freedom for selecting materials for constituting the semiconductive layer by introducing an insulative substrate capable of withstanding high-temperature processes.

The second object of the invention is to provide a novel photovoltaic device which generates a substantially large photoelectrically converted output by providing substantial light-absorption characteristics throughout the entire region of visible rays and by providing a semiconductive layer with tandem constitution having a plurality of semiconductor junctions.

Electrical connection between the transparent electrode layer and the second back electrode layer of the photoelectric converter element of the photovoltaic device of the invention is achieved by means of contact holes whose inner circumferential surfaces are composed of an insulative layer and a semiconductive layer having identical diameter.

The third object of the invention is to provide a novel photovoltaic device which provides sufficient distance between the transparent electrode layer and the first back electrode layer even if the semiconductive layer is very thin.

The fourth object of the invention is to provide a novel photovoltaic device which is perfectly free from occurrence of current leakage and accidental short circuit.

In the process for manufacturing the photovoltaic device of the invention, the size and interval of the contact holes are precisely determined according to the output voltage based on the calculated output current at the contact between the transparent electrode layer and the second back electrode layer. In addition, the thickness of the transparent electrode layer is also determined according to the output voltage based on the calculated output current at the above contact.

The fifth object of the invention is to provide a novel photovoltaic device which is provided with optimal output characteristic and capable of generating the maximum value of output power.

When manufacturing the photovoltaic device related to the invention, a plurality of contact holes are formed by applying an energy beam.

The sixth object of the invention is to provide a novel method of manufacturing a photovoltaic device capable of reducing the number of processing steps and operating time.

The seventh object of the invention is to provide a novel method of manufacturing a photovoltaic device capable of precisely forming fine contact holes at desired positions.

When executing the process for forming fine contact holes by applying an energy beam, the invention provides asemiconductive layers from the region designated for forming fine contact holes by applying the energy beam after performing sequential steps for removal of the first back electrode layer from the contact-hole-forming region while leaving part or all of the semiconductive layer and then forming the insulative layer.

The eighth object of the invention is to provide a novel method of manufacturing a photovoltaic device capable of selectively removing the insulative layer formed on the transparent electrode layer.

The above and further objects and features of the invention will more fully be apparent from the following detailed description with accompanying drawings.

DESCRIPTION OF THE PREFERRED EMBODIMENTS

Referring now to the accompanying drawings, a preferred embodiment of the photovoltaic device related to the invention is described below.

Figure 1:
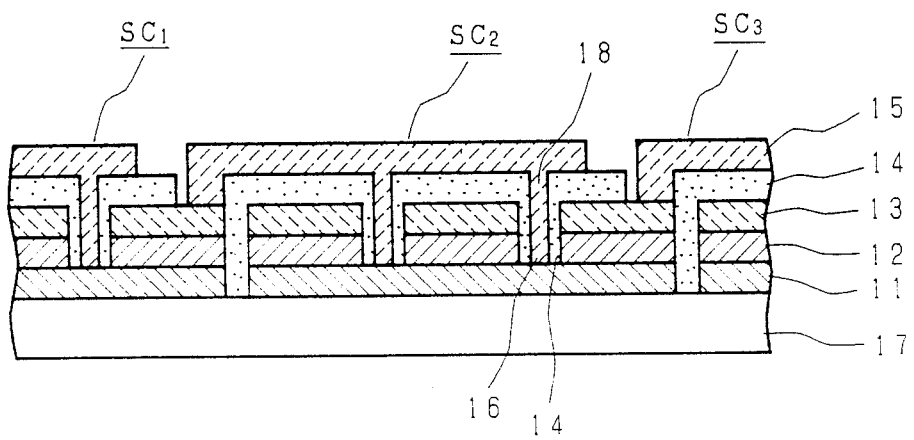
FIG. 1 is a sectional view showing essential constituents of a conventional photovoltaic device.
Figure 2:
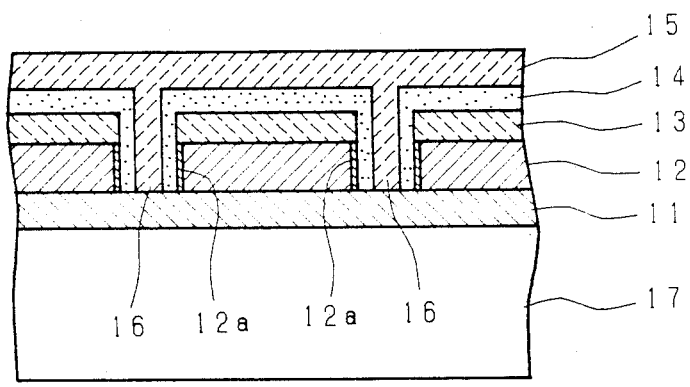
FIG. 2 is an enlarged view of part of a photoelectric converter element of a conventional photovoltaic device.
Figure 3:
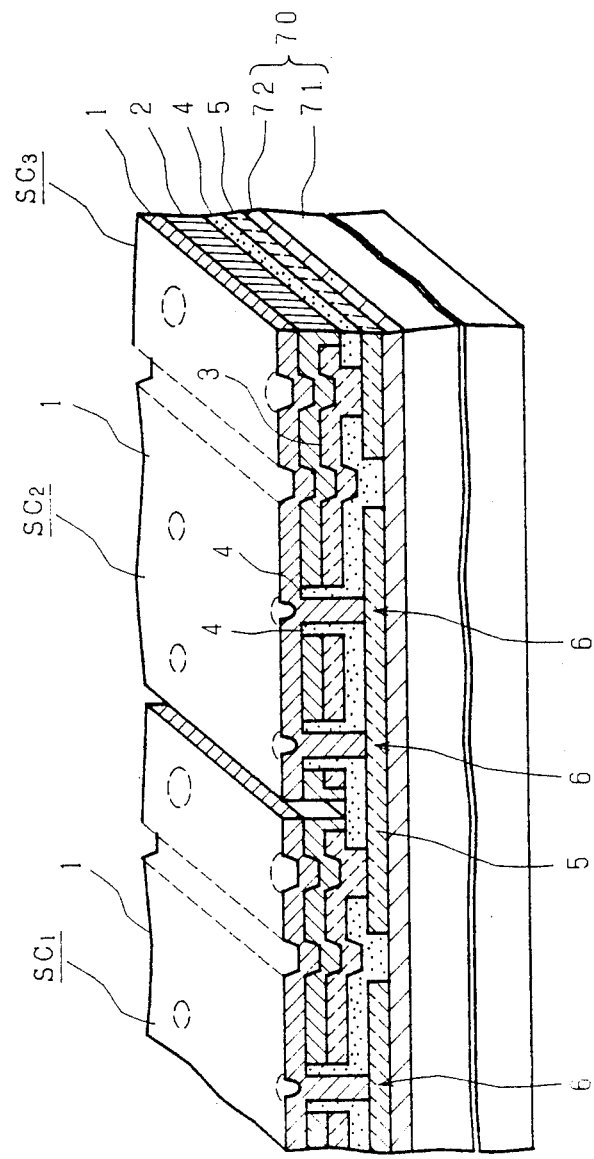
FIGS. 3 and 4 are partially sectioned perspective views of essential constituents of the photovoltaic device of the invention.

FIG. 3 is a partially sectioned perspective view of the essential constituents of the photovoltaic device of the invention shown from the light incident side. Unlike the conventional photovoltaic device mentioned earlier allowing entry of light from the insulative substrate side, the photovoltaic device illustrating the preferred embodiment of the invention allows entry of light from the opposite direction. As a result, light permeability is not required for the substrate, and thus, the preferred embodiment uses a metal sheet having the surface coated with insulative layer for constituting the insulative substrate.

Each of the photoelectric converter elements $SC_1$, $SC_2$, $SC_3$, ... is respectively composed of the following constituents disposed in superimposed relation, where the photovoltaic device is viewed from the light-incident side: light-permeable light-receiving electrode layer (i.e. transparent electrode layer) 1 made from TCO, semiconductive layer 2 mainly composed of amorphous silicon for example, where the semiconductive layer 2 contains a photo-active layer made from a combination of semiconductors having a pin junction or a pn junction in parallel with the layer surface, first back electrode layer 3 composed of ohmic metal, insulative layer 4 composed of $SiO_2$, $Si_3N_4$, AlN, $Al_2O_3$, polyimide, insulative epoxy or resist paste, and second back electrode layer 5 composed of metal having a resistance value lower than that of transparent electrode layer 1, where the metal is composed of either a single layer or plural layers of aluminum, silver, titanium, chrome, or nickel, or conductive paste composed of nickel, silver, or copper paste. The second back electrode layer 5 or another conductor is inserted in a plurality of contact holes 6 provided in plural locations of the light-receiving region, where the inner surface of each contact hole 6 is surrounded by insulative layer 4. As a result, the transparent electrode layer 1 is electrically connected to the second back electrode layer 5. A number of photoelectric converter elements $SC_1$, $SC_2$, $SC_3$, ... are respectively formed on the insulative substrate 70 which is composed of a composite sheet consisting of a metal sheet 71 made from heat-resistant stainless steel or aluminum, covered with insulative layer 72 made from enamel or pin-hole-clogged alumina film. The first back electrode layer 3 of one adjacent photoelectric converter element is combined with the second back electrode layer 5 of the other adjacent photoelectric converter element in order that all the adjacent photoelectric converter elements are electrically connected to each other in series.

The insulative substrate 70 of the preferred embodiment of the invention features much more improved heat resistance than that of any conventional insulative substrate. This makes it possible for the embodiment of the invention to form semiconductive layer 2 by a thermal CVD process. For example, polycrystalline silicon produced from thermal CVD process of $SiH_4$ can be effectively used. A flexible photovoltaic device can be also produced by using a thin metal sheet 71.

When making the preferred embodiment of the invention, the manufacturer can freely select the material making up semiconductive layer 2. This facilitates provision of more than two semiconducting junctions in the semiconductive layer 2 in parallel with the layer surface. In addition, by increasing the optical band gap $E_{B.G.}$ of the light-incident side of the semiconducting material having more than two semiconducting junctions and by decreasing the optical band gap of the back side, the peak wave length of light absorption and light-absorbing band can be shifted in increments. As a result, the semiconductive layer 2 can be provided with a very wide light-absorptive characteristic covering extensive wave lengths. For example, the preferred embodiment can provide a very high light-absorptive characteristic throughout the entire wavelength range of visible rays by using a tandem structure (i.e., multiple junctions) which provides superimposition of the following; (1) a pin junction layer composed of P-type amorphous silicon carbide of wide-band gap in which the peak wave length of absorbable light is in the short-wavelength range of visible rays, i-type and n-type amorphous silicon, and (2) a pn junction layer composed of p-type and n-type polycrystalline silicon of narrow-band gap in which the peak wavelength of absorbable light in the long wavelength region of visible rays by disposing the pin junction layer at the light-receiving-side. Accordingly high photoelectric conversion output is obtained.

The above construction can also utilize polycrystalline silicon for the semiconducting material. This is possible due to the ability to form semiconductive layer 2 by a high-temperature process using insulated metal sheet 71 for the substrate 70.

This embodiment provides a single semiconducting junction for the semiconductive layer 2. Also, the semiconductive layer 2 may be provided with more than two semiconducting junctions formed by low-temperature process because an amorphous germanium or silicon germanium layer having a narrowband gap can be produced at low temperature.

Figure 4:
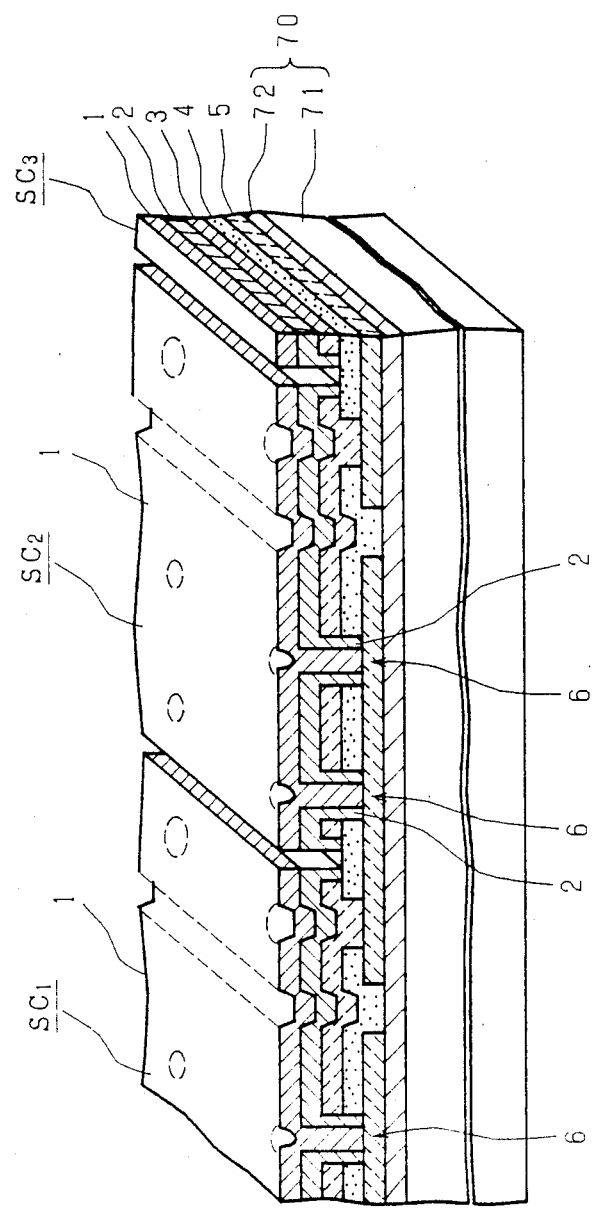

FIG. 4 is a variation of the preferred embodiment shown in FIG. 3. It features circumferential walls of the contact holes 6 which are fully covered with semiconductive layer 2 instead of the insulative layer 4. This embodiment is effectively applicable when the resistance of the semiconductive layer 2 is high, as in situations where use of an amorphous semiconductor is ideal.

Figure 5:
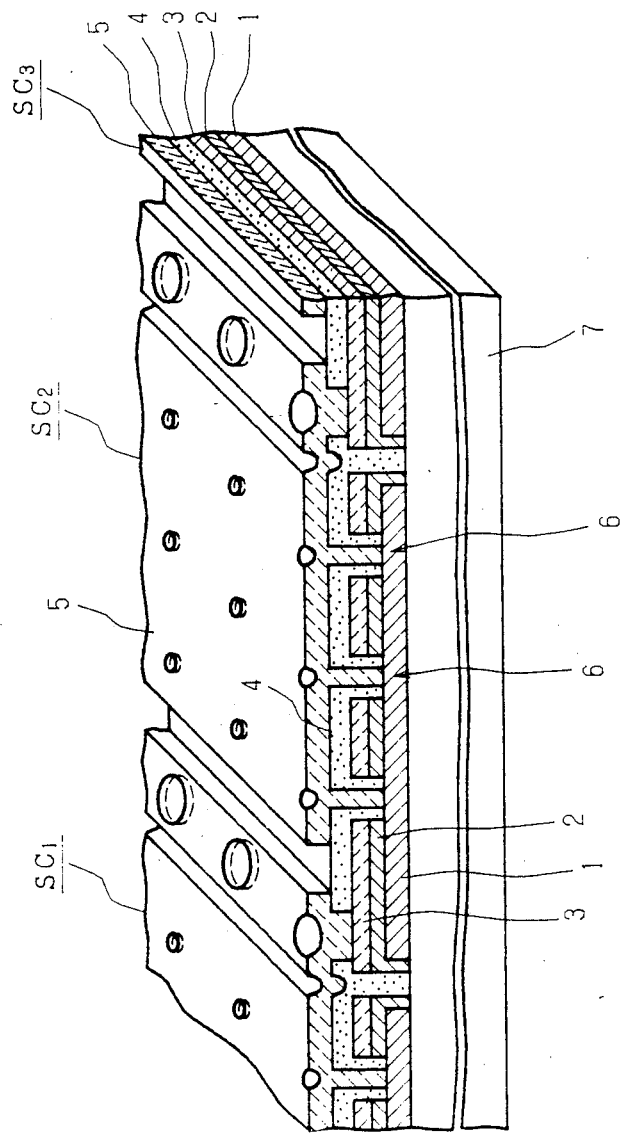
FIG. 5 is a partially sectioned perspective view of essential constituents of the photovoltaic device manufactured by the method embodied by the invention.

FIG. 5 is a partially sectioned perspective view of the essential constituents of another embodiment of a the photovoltaic device manufactured by the method embodied by the invention, where the essential constituents are viewed from the back side. The photovoltaic device shown in FIG. 5 has a constitution similar to the conventional photovoltaic device described earlier, where the insulative substrate 7 is made from transparent glass. Although the other constituents are superimposed in the opposite direction, they are made from the same materials as those used for the above embodiment, and thus, those corresponding materials are designated by identical reference numerals in FIG. 5 without further explanation.

Figure 6A:
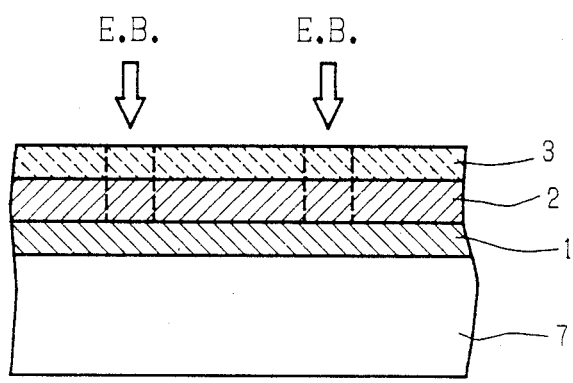
FIGS. 6A-6C are sectional views of the photovoltaic device being sequentially processed by the method embodied by the invention.
Figure 6B:
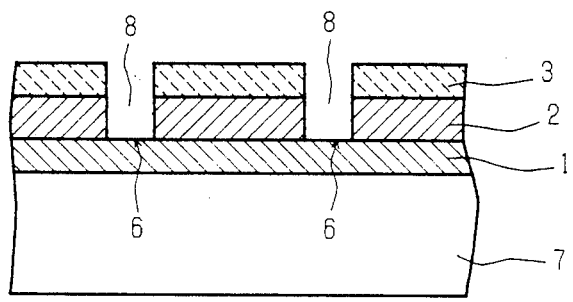
Figure 6C:
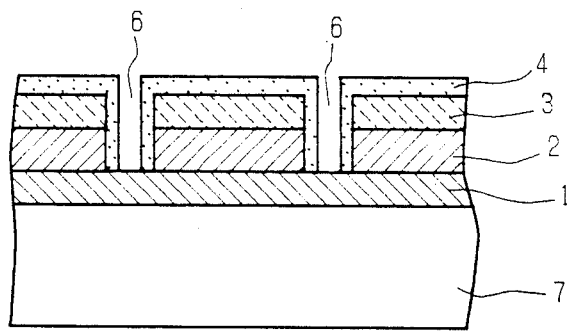

When manufacturing photovoltaic devices having the above constitution by applying the method embodied by the invention, in order to form contact between the transparent electrode layer 1 and the second back electrode layer 5, first, the first back electrode layer 3 is superimposed on the semiconductive layer 2 and fully covers the transparent electrode layer 1, and then the superimposed layer is exposed to radiation from an energy beam E.B., such as a laser or electron beam at a plurality of predetermined locations, as shown in FIG. 6(a) by an arrow. FIG. 6(b) shows the state of the superimposed layers after being exposed to the radiation of energy beam E.B. As a result of the radiation of energy beam E.B., holes 8 are discretely formed in about 1 to 2% of the light-receiving region to expose the transparent electrode layer 1. More specifically, a YAG laser incorporating Q switching and 1.06 $\mu$m wavelength is used for radiating an energy beam E.B. of $1 \times 10^6$ to $5 \times 10^7$ W/cm$^2$ power density onto an amorphous silicon semiconductive layer 2 of about 5,000 A thickness, or against aluminum layer having about 1,000 A thickness, or a first back electrode layer 3 made from titanium. Each of these holes 8 may be of round shape of about 100 $\mu$m to 1 mm diameter, or it may be of rectangular shape of about 100 $\mu$m to 1 mm length, or the hole 8 may be of any other shape. However, since the energy beam has a round sectional shape, provision of a round shaped hole is advantageous when no scanning is performed. A gaussian an distribution of the energy of beam vs. the center axis of beam occurs. Consequently, if it is necessary to scan the energy beam because a beam having a very fine diameter and high energy is used by means of cutting off the shallow sloped portions of the energy distribution with an iris, it is preferred to process the hole into rectangular shape using a rectangular iris. An energy beam is also used for dividing the semiconductive layer 2 and the first back electrode layer 3 into photoelectric converter elements $SC_1$, $SC_2$, $SC_3$ . . . A number of fine holes 8 each having about 100 $\mu$m to 1 mm diameter or side length are thus formed by performing those processes mentioned above, where these holes 8 occupy an area corresponding to about 0.5 through 5% of the total light-receiving region. Then, a coating is applied to the first back electrode layer 3 and fine holes 8 to form insulative layer 4 composed of photosensitive resin. Then, a light-exposure and developing process is applied for completing formation of contact holes 6 by fully covering the inner wall of hole 8 as shown in FIG. 6(c). When the contact holes 6 are completed, the transparent electrode layer 1 is again exposed.

The above method forms contact holes 6 after execution of light-exposure and developing processes. The embodiment also forms contact holes 6 using the pattern-printed insulative layer 4 as shown in FIG. 6(c) including inner wall of holes 8 shown in FIG. 6(b). Alternatively, contact holes 6 may be formed by executing the following steps; first, the first back electrode layer 3 and holes 8 are fully covered with a coating of photosensitive resin so that insulative layer 4 is formed, and then, the insulative layer 4 is exposed to radiation from energy beams E.B. so that predetermined portions of the insulative layer 4 can be removed before contact holes 6 are eventually formed.

Finally, the second back electrode layer 5 composed of metallic paste containing nickel or silver is patterned by screen printing all over the insulative layers 4 of photoelectric converter elements $SC_1$, $SC_2$, $SC_3$, . . . and then, these photoelectric converter elements are connected to each other in series. At the same time, the second back electrode layer 5 also fills contact holes 6. When completing connection of all the photoelectric converter elements, the contacts of transparent electrode layers 1 and second back electrode layers 5 are also completed simultaneously.

The above method forms a pattern of the second back electrode layer 5 by screen-printing. Independent of this method, it is also possible for this embodiment to comprise the following steps; first, formation of the second back electrode layer 5 on the insulative layer 4, followed by separation of the second back electrode layer 5 from each photoelectric converter element by radiating an energy beam on layer 5.

Figure 7:
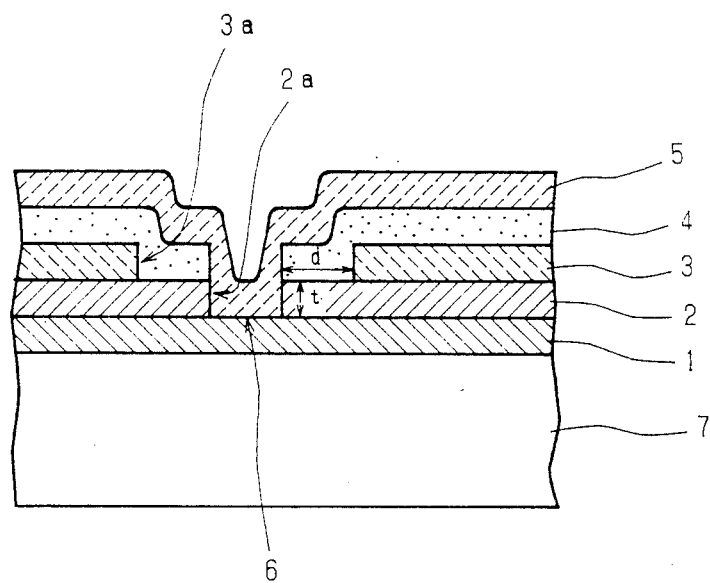
FIGS. 7 and 9 are sectional views of a photoelectric converter element of another preferred embodiment of the photovoltaic device related to the invention.
Figure 8:
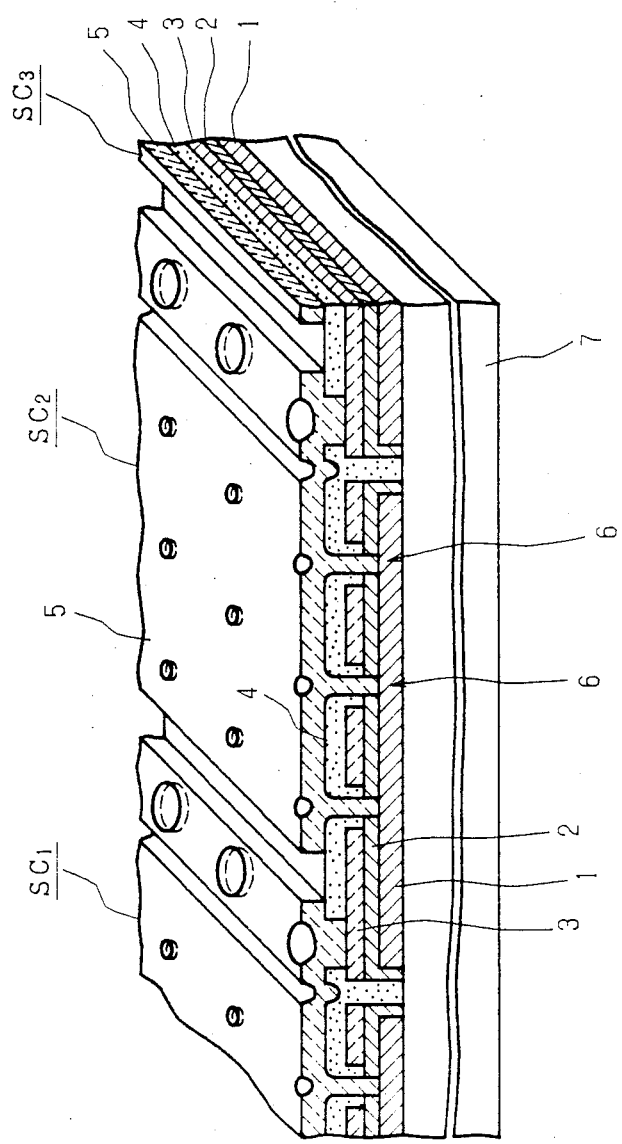
FIGS. 8 and 10 are partially sectioned perspective views of another preferred embodiment of the photovoltaic device of the invention.

FIG. 7 is a sectional view of the photoelectric converter element. In this embodiment, the inner surface of each contact hole 6 comprises semiconductive layer 2 and insulative layer 4. More specifically, the diameter of the hole in the first back electrode layer 3 is wider than that of the contact hole 6, whereas the hole in the semiconductive layer 2 has the same diameter as that of the hole of the insulative layer 4. Edge 3a of the first back electrode layer is behind the edge 2a of the semiconductive layer 2. A plurality of photoelectric converter elements each having the above constitution are connected to each other in series on the transparent insulative substrate 7, wherein the second back electrode layer 5 of one adjacent photoelectric converter element is connected with the first back electrode layer 3 of the other adjacent photoelectric converter element so that the photovoltaic device related to the invention can integrally be completed. FIG. 8 is a partially sectioned perspective view of a photovoltaic device of the invention.

Any conventional photovoltaic device provides an insulation distance L between the transparent electrode layer 1 and the first back electrode layer 3 across a very thin thickness "t" of semiconductive layer 2. On the other hand, owing to the constitution described above, the preferred embodiment of the invention shown in FIG. 7 provides an insulation distance L which is the sum of the thickness "t" of semiconductive layer 2 and the retracted length "d" of the first back electrode layer 3 ($L=t+d$). As a result, effective insulation length L is significantly longer than that of any conventional photovoltaic device. Because of this, even when edge 2a which is thermally affected by radiation of the energy beam comes into contact with the transparent electrode layer 1, the resistance value between the transparent electrode layer 1 and the first back electrode layer 3 remains sufficiently high, thus rarely resulting in decrease of output otherwise caused by the adverse effects of leakage current or accidental short circuit.

Figure 9:
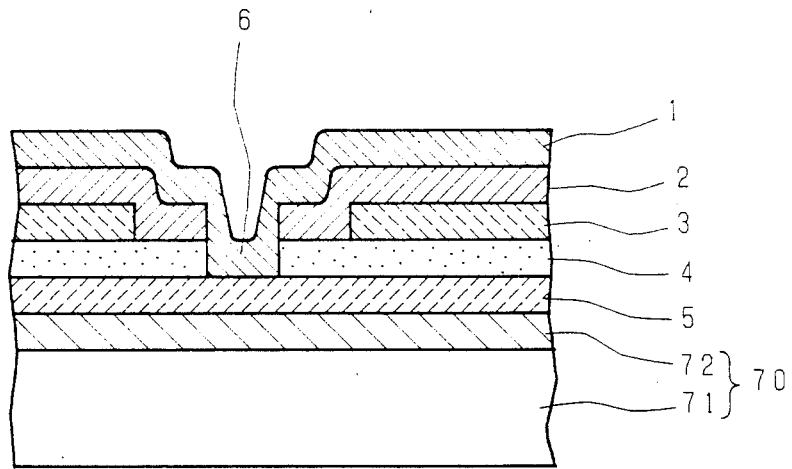
Figure 10:
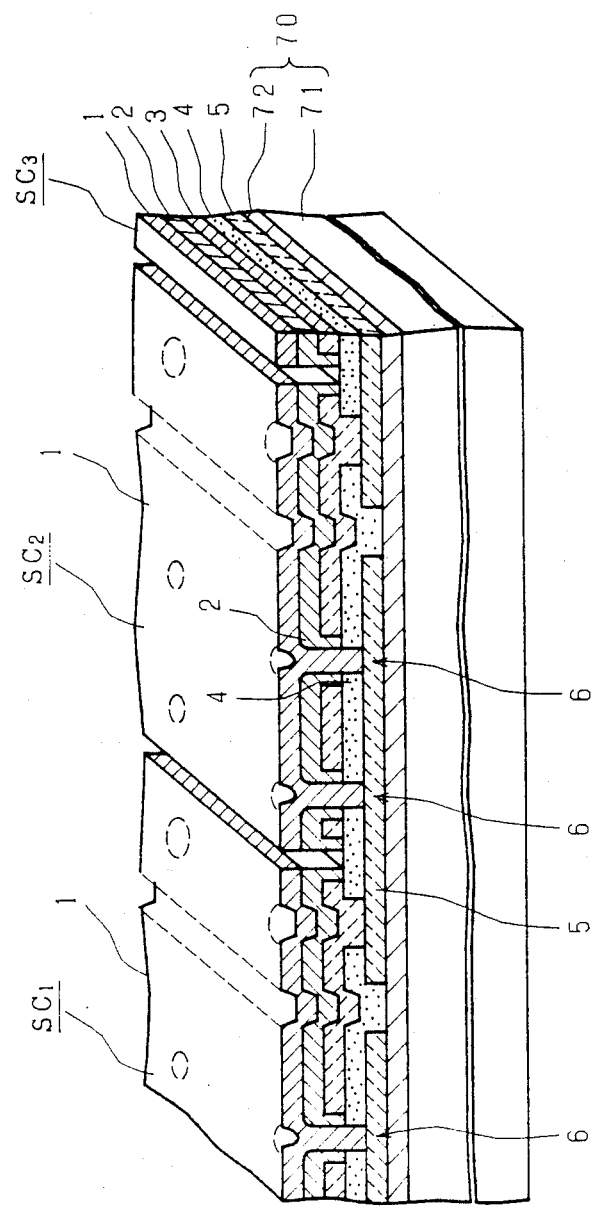

FIG. 9 is the sectional view of another embodiment of the photoelectric converter element of the above invention. FIG. 10 is a partially sectioned perspective view of a photovoltaic device of the invention, which is composed of a plurality of photoelectric converter elements connected in series and having varied constitution. This embodiment uses insulative substrate 70 composed of a composite sheet made from metal sheet 71 which is coated with insulative layer 72. This embodiment employs the inverted light-incidence direction. Even when using such photovoltaic device having a different construction from the above embodiments, it reliably achieves the same effect as the foregoing embodiments.

Figure 11A:
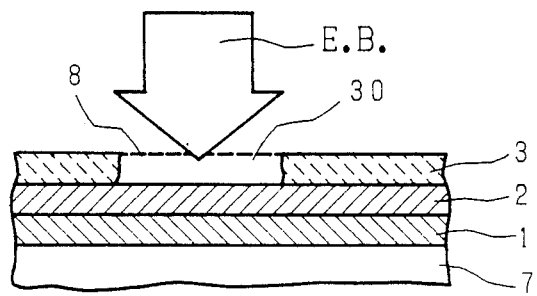
FIGS. 11A-11B, 12A-12D and 13A-13C are sectional views of the photovoltiac device being sequentially processed by the process according to another preferred embodiment of the method of the invention.
Figure 11B:
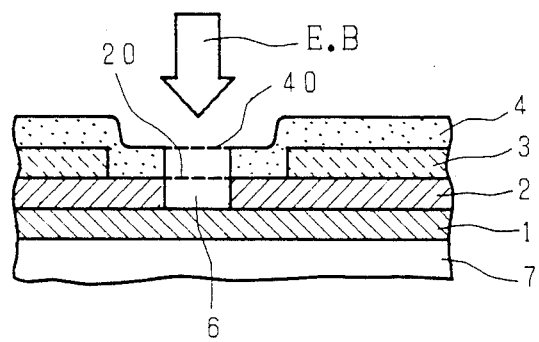
Figure 12A:
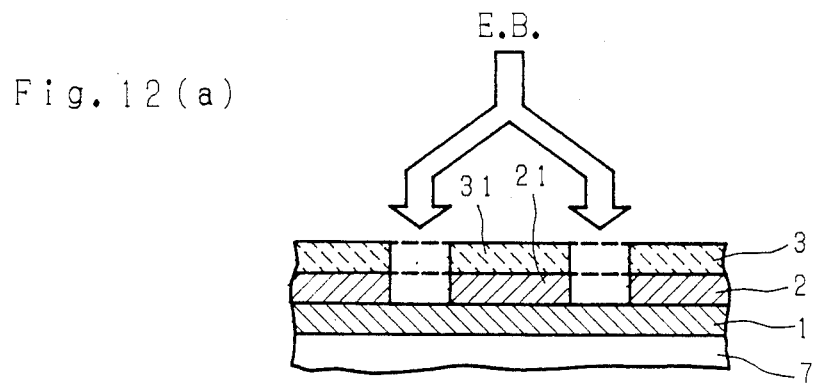
Figure 12B:
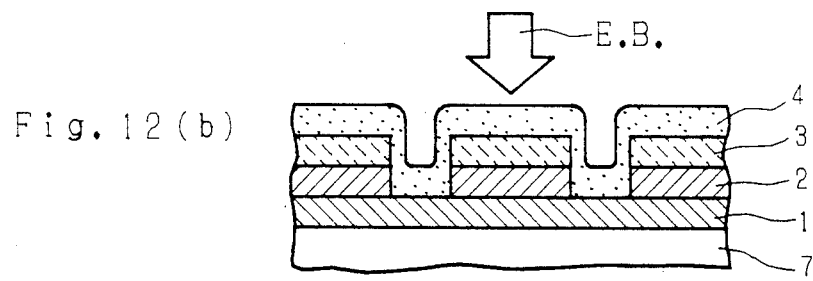
Figure 12C:
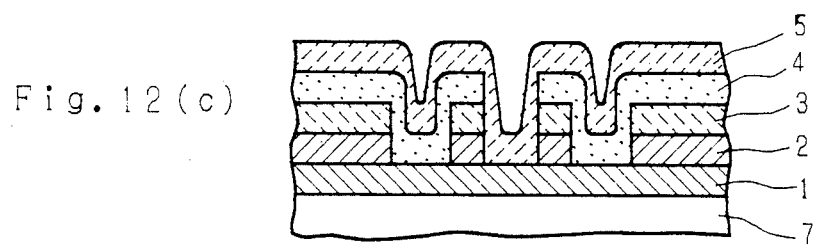
Figure 12D:
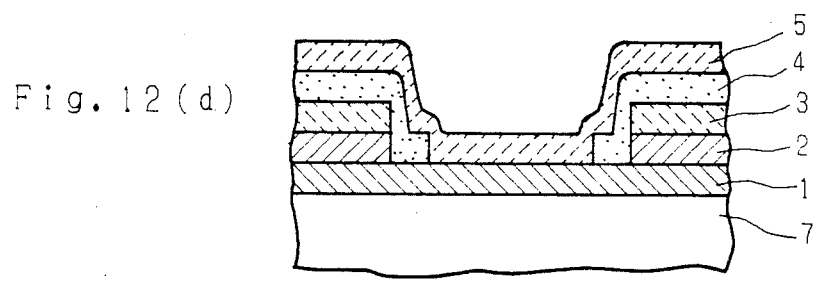

Next, a method of manufacturing photoelectric converter elements having the constitution shown in FIG. 7 is described below. First, transparent electrode layer 1, semiconductive layer 2, and the first back electrode layer 3 are formed on the insulative substrate 7. Then, as shown in FIG. 11(a), leaving at least part of semiconductive layer 2 at the portion where contact is to be made, hole 8 having 0.1 to 1.0 mm of circular or rectangular shape is formed by removing first back electrode layer portion 30. Next, insulative layer 4 is formed in order that hole 8 and the exposed portion of semiconductive layer 2 can be covered together. Next, as shown in FIG. 11(b), together with residual portion 20 of semiconductive layer 2, insulative layer portion 40 is removed in the form of a circle or rectangle having 0.05 to 0.8 mm diameter or side length so that the transparent electrode layer 1 can be exposed on the surface. Next, the second back electrode layer 5 is formed so that the contact shown in FIG. 7 can eventually be formed. Radiation of energy beam E.B. for removing the first back electrode layer portion 30 and the insulative layer portion 40 containing semiconductive layer portion 20 shown in FIG. 11 facilitates formation of fine contacts and is quite effective for generating high output. Energy beam E.B. may be radiated either in the direction of the transparent electrode layer 1 or in the direction of the back electrode. To effectively radiate an energy beam with a laser, it is suggested to use a YAG laser incorporating Q switching having 1.06 $\mu$m wavelength so that it can emit energy containing $1 \times 10^6$ to $1 \times 10^8$ W/cm$^2$ of power density. The manufacturing process shown in FIG. 11(b) deserves attention because the radiated energy beam fully permeates the insulative layer portion 40 covering the contact-ready portion without being absorbed by the layer. It is absorbed in the lower semiconductive layer portion 20, and consequently the semiconductive layer portion 20 instantaneously vaporizes and is removed together with the upper insulative layer portion 40. More specifically, the insulative layer 40 cannot be selectively removed from the transparent electrode layer 1. However, since the embodiment allows the semiconductive layer 2 to remain as the beam absorbent, radiation of the energy beam effectively facilitates selective removal of the insulative layer portion 40.

Referring now to FIG. 12, an example of the electrical contact formed by the method of the invention is described below. As shown in FIG. 12(a), first, the periphery of the specific portion to be electrically connected in the final stage is removed by radiation of energy beam E.B. with iris having a scanning or circle/rectangle permeation device in order that the central semiconductive layer portion 21 and the first back electrode layer portion 31 remain unaffected. Next, as shown in FIG. 12(b), insulative layer 4 is formed. Then, at least a part of the remaining semiconductive layer portion 21 and the first back electrode layer portion 31 are removed together with the insulative layer 4 on the top by radiation of energy beam E.B. Next, the second back electrode layer 5 is formed so that it is electrically connected to the transparent electrode layer 1. Depending on the size of the removable portion of the insulative layer 4, the area of the electrical contact is variable as shown in FIGS. 12(c) and 12(d).

Figure 13A:
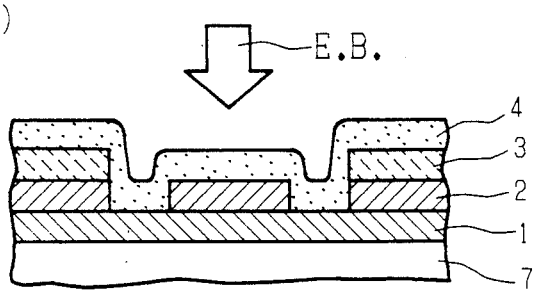
Figure 13B:
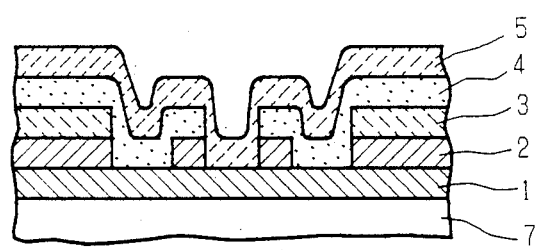
Figure 13C:
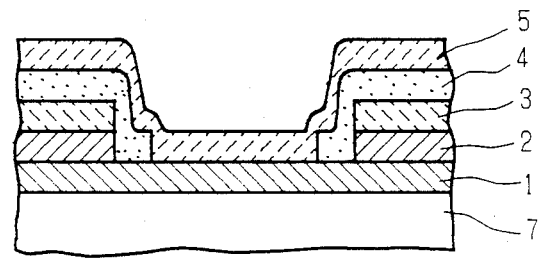

Referring now to FIG. 13, another example of the electrical contact manufactured by the method of the invention is described below. FIG. 13(a) shows a process for removing the insulative layer 4 after removing the first back electrode layer 3 in the center. By applying energy beam E.B., the periphery of the specific portions to be electrically connected in the final stage is removed. FIGS. 13(b) and 13(c) respectively show the configurations of the complete electrical contact after removing the different amounts of insulative layer 4 together with the semiconductive layer 2.

The size and the interval of the contact holes 6 are very important factors in manufacturing the photovoltaic device. Reduction of the size of contact holes 6 decreases the ineffective area in the light-receiving region. On the other hand, provision of small contact holes 6 results in poor workability in the manufacturing operation.

If the size of contact hole 6 is reduced too much, contact resistance between the transparent electrode layer 1 and the second back electrode layer 5 increases in the center of contact hole 6 which collects current, and as a result, resistance loss cannot be reduced. Conversely, if the size of contact hole 6 is increased to promote convenience in manufacturing the photoelectric converter elements, the larger the number of contact holes is, the larger the ineffective area is in the light-receiving region. If the number of contact holes 6 is reduced, current collection in these contact holes 6 is lowered, and thus, resistance loss in the transparent electrode layer 1 cannot be minimized. In summary, certain optimal values are present for the size and the intervals of the disposed contact holes 6 in order that maximum output can be generated from the device.

Based on the above considerations, the inventors calculated the volume of output current at contact holes 6 when determining the size and pitch intervals of these contact holes 6, and then, based on the calculated value, the inventors devised the output voltage. Note that the pitch intervals of contact holes correspond to the number of contact holes in the effective area of the light-receiving region.

Figure 14:
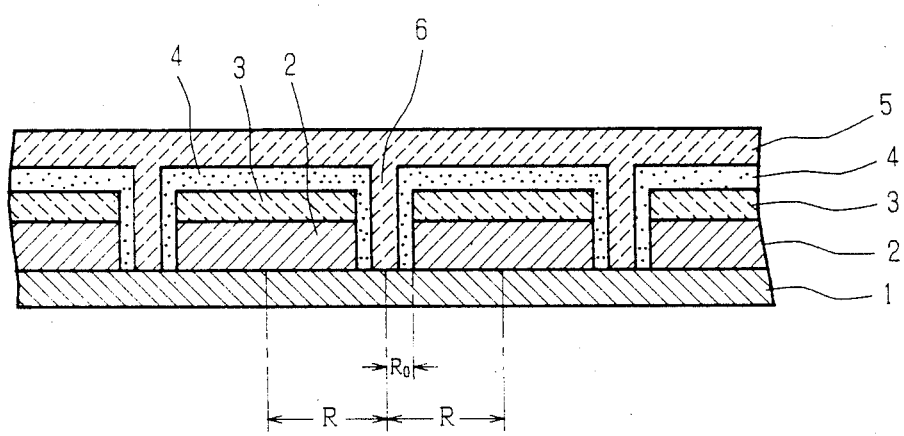
FIG. 14 is a sectional view of essential constituents of the photovoltaic device of the invention.
Figure 15:
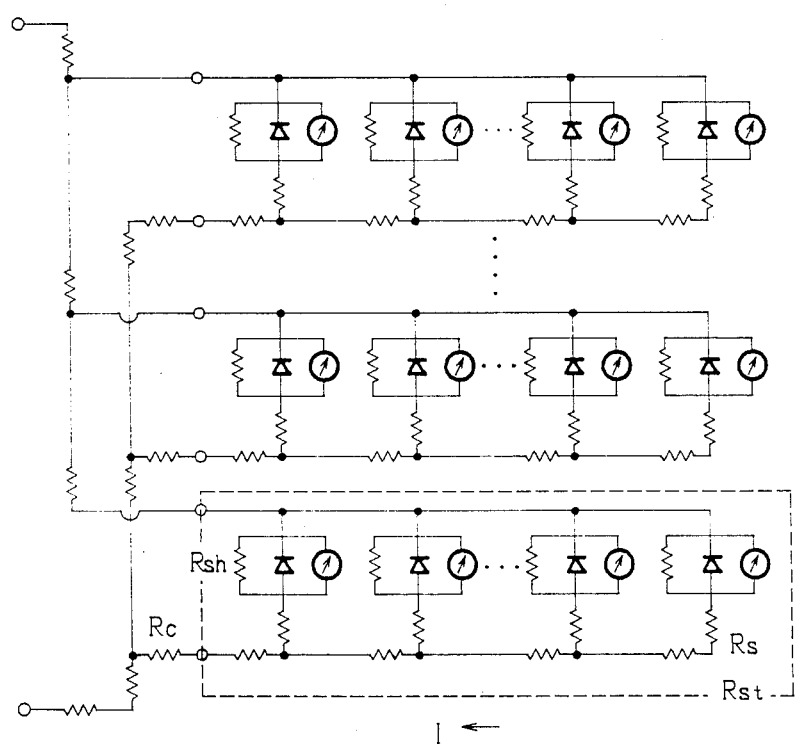
FIG. 15 is the equivalent circuit diagram representing one section of a module.
Figure 16:
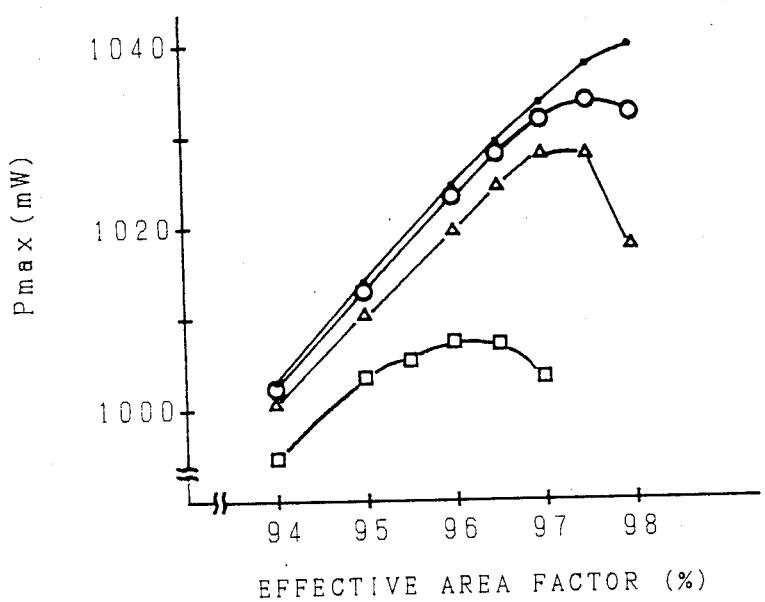
FIG. 16 is a graph showing the relationship between the maximum output (Pmax) of the photovoltaic device according to the invention as a function of the effective area factor with radius of the contact hole as a parameter.

FIG. 14 is a sectional view of a contact hole 6. FIG. 16 is the equivalent circuit diagram corresponding to one section of the module, in which the portion surrounded by the broken line corresponds to one contact hole 6.

Current is generated inside of the circle having radius R before being collected by each contact hole 6. Each circle is drawn centered on the contact hole 6 so that each remain in contact with each other, centered on each respective contact hole 6 and have an area identical to that of the square which is sectioned, in parts having identical area. As a result, the radius R of each circle is automatically determined. The first expression shown below represents current output $I_{out}$ from each contact hole 6.

$$I_{out} = 2\pi \int_{R_O}^{R} r \cdot i(r) \cdot dr. \tag{1}$$

where R designates the radius of the circle, $R_O$ the radius of contact hole 6, and i(r) the volume of current generated in a differential area.

The volume of current i(r) is calculated by the second and third expressions shown below.

$$i(r) = i_{ph} - i_o \left[ \exp \frac{q(v(r) + R_s i(r))}{nkT} - 1 \right] - \frac{v(r) + R_s i(r)}{R_{sh}} \tag{2}$$

$$\frac{dv(r)}{dr} = I(r) \frac{R_{st}}{2\pi r} \tag{3}$$

where $i_{ph}$ designates the density, of photocurrent, $i_o$ the saturated current density in the inverse direction, v(r) the voltage at the point of radius r, $R_s$ series resistance, $R_{sh}$ shunt resistance, n-value of diode characteristic, q charge, k Boltzmann's constant, T absolute temperature, $R_{st}$ sheet resistance, and I(r) the total volume of current flowing in the direction of contact hole 6 in a ring-form region at the point of radius r.

FIG. 16 is a graph representing the relationship between the maximum output of the photovoltaic device and the effective area factor with radius $R_O$ of contact hole 6 as a parameter, using the expressions shown above. The photovoltaic device used in determining FIG. 16 is 10 cm×10 cm in size and incorporates 10 units of photoelectric converter elements $SC_1$ through $SC_{10}$ which are disposed at 0.15 mm intervals. The photovoltaic device has an effective area factor of 98.5%. Point symbol (•) designates that contact hole 6 has 0.10 mm radius. Circle symbol ○ designates that contact hole 6 has 0.15 mm radius. Triangle symbol Δ designates that contact hole 6 has 0.25 mm radius. Square symbol □ designates that contact hole 6 has 0.55 mm radius.

As is clear from the graph shown in FIG. 16, when the contact hole 6 has 1.10 mm radius, maximum output increases until the effective area factor reaches 98%. However, if the contact hole 6 has 0.15 mm, or 0.25 mm, or 0.55 mm radius, the maximum output does not increase in conjunction with increase of the effective area factor, but the output reaches a peak at 97.5% effective area factor when the contact hole 6 has 0.15 mm or 0.25 mm radius. When the contact hole 6 has 0.55 mm radius, output is maximum at 96.3% effective area factor. As a result, based on the calculation of those three expressions shown above, the invention can determine optimal radius and the number of each contact hole 6, i.e., the effective area factor.

Figure 17:
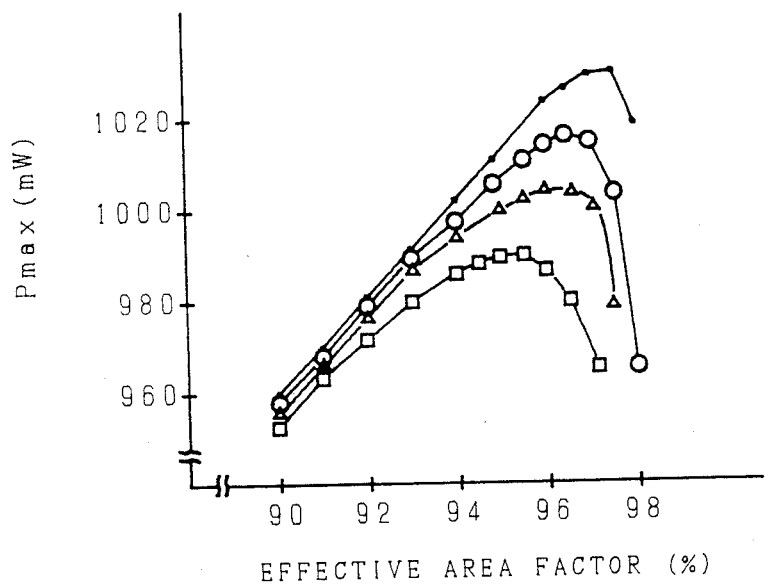
FIG. 17 is a graph showing the relationship between the maximum output (Pmax) of the photovoltaic device according to the invention as a function of the effective area factor, using the sheet resistance of the transparent electrode layer as a parameter.

FIG. 17 is a graph representing the relationship between the maximum output of the photovoltaic device and the effective area factor using as a parameter the sheet resistance $R_{sl}$ of the transparent electrode layer 1, determined by the expressions shown above. The contact hole 6 of the photovoltaic device used for the evaluation shown in FIG. 17 has 0.25 mm radius. Point symbol (●) designates that the transparent electrode layer 1 has 10 $\Omega/\square$ sheet resistance. Circle symbol ○ designates that the transparent electrode layer 1 has 30 $\Omega/\square$ sheet resistance. Triangle symbol △ designates that the transparent electrode layer 1 has 50 $\Omega/\square$ sheet resistance. Square symbol □ designates that the transparent electrode layer 1 has 100 $\Omega/\square$ sheet resistance.

As is clear from FIG. 17, there is an optimal number of contact holes 6 capable of generating maximum output in accordance with the sheet resistance of the transparent electrode layer 1. In other words, there is an optimal effective area factor. More specifically, where the transparent electrode layer 1 has sheet resistance values of 10 $\Omega/\square$, 30 $\Omega/\square$, 50 $\Omega/\square$, and 100 $\Omega/\square$, the optimal effective area factors are 97.5%, 96.5%, 96%, and 95.5%, respectively. In this case, based on the calculations using the three expressions shown above, the invention can determine optimal radius and the number of each contact hole 6, i.e., the effective area ratio, in accordance with the sheet resistance value.

Description of the above preferred embodiment has merely referred to the use of insulation substrate 7 composed of transparent glass sheet and the like. However, even when manufacturing a photovoltaic device incorporating the insulative substrate 70 composed of metal sheet 71 and insulative layer 72 shown in FIG. 3 or 4, it is also possible for the preferred embodiment to properly determine the size and the interval (number) of contact holes 6 by considering output power in conjunction with calculated current output at contact holes 6 by applying those expressions shown above.

Although the above embodiment uses circular contact holes 6, it is also possible to utilize other shapes, such as square, for example. When providing square contact holes 6, current to be collected by each contact hole 6 is generated inside of squares which are in contact with each other centering each contact hole 6 and sectioned into the same area. Accordingly, the size and the interval of contact holes 6 can be determined by calculating the current generated inside of squares.

Figure 18:
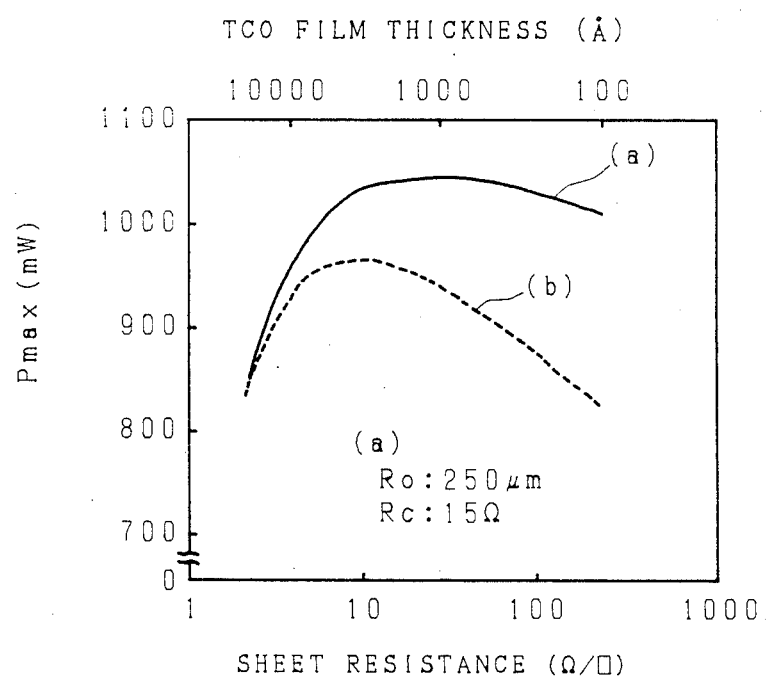
FIG. 18 is a graphical representation of the relationship between the maximum output (Pmax) of the photovoltaic device and the sheet resistance and thickness of the transparent electrode layer.

To provide high output for the photovoltaic device, thickness of the transparent electrode layer 1 is an important factor. A certain optimal value is present for the thickness. FIG. 18 is a graph showing the maximum output (Pmax) as a function of sheet resistance value thickness of the transparent electrode layer 1. In connection with the equivalent circuit shown in FIG. 16, the graph shown in FIG. 18 shows the result of the calculation of the output characteristic of the entire module in accordance with the relationship between current I(r) generated per unit area which denotes the operating condition of minimal photovoltaic area and the voltage V(r) in the radial direction. Solid line (a) in FIG. 18 represents the output characteristic of the photovoltaic device embodied by the invention, whereas broken line (b) represents that of a conventional photovoltaic device, respectively. Both of these devices are composed of a 10 cm × 10 cm integrated module.

As is clear from the curves shown in FIG. 18, in order to allow Pmax to reach the maximum value, a certain optimal value of the thickness is present for the transparent electrode layer 1. Accordingly, when manufacturing the photovoltaic device embodied by the invention, very high output of current can be achieved by designing the thickness of the transparent electrode layer 1 to correctly match the optimal value.

When sheet resistance value rises, Pmax sharply decreases in any conventional photovoltaic device. On the other hand, the photovoltaic device embodied by the invention provides the peak Pmax value when the sheet resistance is high. Even if the sheet resistance value rises by two orders of magnitude, the output declines only slightly by several percent.

The above preferred embodiments respectively use a YAG laser which is capable of emitting 1.06 $\mu$m wavelength energy beam. Alternatively, it is also possible for these embodiments to use the second harmonic of a YAG laser having 0.53 $\mu$m wavelength for example. Instead of a YAG laser, an electron beam may also be used.

As this invention may be embodied in several forms without departing from the spirit or essential characteristics thereof, the Present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A photovoltaic device, comprising:
   a coated substrate that is opaque;
   an electrode layer on said substrate; and
   a photovoltaic converter element structure on said electrode layer, said structure including a stack of layers arranged from said electrode layer which include in sequence an insulative layer, a first back electrode layer, a semi-conductive layer containing a photo-active layer, and a transparent electrode layer, said structure including a contact hole which extends through said stack to said electrode layer that is on said coated substrate, said first back electrode layer being retracted from said contact hole to define a space which is filled in by said semi-conducive layer, said electrode layer which is on said substrate constituting a second back electrode layer, said transparent electrode layer extending into said contact hole to fill a portion of said contact hole which is smaller than all of said contact hole, said transparent electrode layer being in contact with said semi-conductive layer and said insulative layer and in electrical contact with said second back electrode layer by filling said portion of said contact hole, said semi-conductive layer being stepped, said transparent electrode layer being conformally stepped so as to have a stepped surface adjacent said contact hole and another surface which is further from said second back electrode layer than is said stepped surface.

2. A photovoltaic device according to claim 1, wherein said semiconductive layer contains a plurality of semiconductor junctions.

3. A photovoltaic device as in claim 1, further comprising a plurality of photovoltaic converter element structures, said second back electrode layer being extended to connect said converter element structures in series with each other.

4. A photovoltaic device, comprising:
a substrate that is transparent;
a transparent electrode layer on said substrate; and
a photovoltaic converter element structure on said transparent electrode layer, said structure including a stack of layers arranged from said transparent electrode layer which include in sequence a semiconductive layer containing a photo-active layer, a first back electrode layer, an insulative layer and a second back electrode layer, said structure including a contact hole which extends through said stack to said transparent electrode layer, said first back electrode layer being retracted from said contact hole to define a space which is filled in by said insulative layer, said second back electrode layer extending into said contact hole to fill only a portion of said contact hole that is smaller than all of said contact hole, said second back electrode layer being in contact with said insulative layer and said semi-conductive layer and in electrical contact with said transparent electrode layer by filling said portion of said contact hole, said insulative layer being stepped, said second back electrode layer being conformally stepped so as to have a stepped surface adjacent said contact hole and another surface which is further from said transparent electrode layer than is said stepped surface.

5. A photovoltaic device comprising a plurality of photoelectric converter elements each as set forth in claim 4 which are disposed on a transparent insulative substrate, wherein said first back electrode layer of one adjacent photoelectric converter element is connected with said second back electrode layer of the other adjacent photoelectric converter element on the back side of said semiconductive layer such that said photoelectric converter elements are electrically connected to each other in series.

6. A photovoltaic device comprising a plurality of photoelectric converter elements each as set forth in claim 4 which are disposed on a metal substrate which has a surface coated with a second insulative layer, said first back electrode layer of one adjacent photoelectric converter element being connected with said second back electrode layer of the other adjacent photoelectric converter element on the back side of said semiconductive layer such that said photoelectric converter elements are electrically connected to each other in series.

* * * * *